United States Patent
Ogino (10) Patent No.: US 10,090,012 B2
(45) Date of Patent: *Oct. 2, 2018

(54) FE-BASES MAGNETIC MATERIAL SINTERED COMPACT

(71) Applicant: JX Nippon Mining & Metals Corporation, Tokyo (JP)

(72) Inventor: Shin-ichi Ogino, Ibaraki (JP)

(73) Assignee: JX Nippon Mining & Metals Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/384,436

(22) PCT Filed: Aug. 6, 2013

(86) PCT No.: PCT/JP2013/071251
§ 371 (c)(1),
(2) Date: Sep. 11, 2014

(87) PCT Pub. No.: WO2014/034390
PCT Pub. Date: Mar. 6, 2014

(65) Prior Publication Data
US 2015/0107411 A1    Apr. 23, 2015

(30) Foreign Application Priority Data
Aug. 31, 2012   (JP) .................................. 2012-191052

(51) Int. Cl.
G11B 5/65    (2006.01)
G11B 5/851   (2006.01)
C23C 14/34   (2006.01)

(52) U.S. Cl.
CPC .......... *G11B 5/653* (2013.01); *C23C 14/3414* (2013.01); *G11B 5/851* (2013.01)

(58) Field of Classification Search
None
See application file for complete search history.

(56) References Cited

U.S. PATENT DOCUMENTS

| | | | |
|---|---|---|---|
| 5,000,800 A | 3/1991 | Sagawa | |
| 6,267,827 B1 | 7/2001 | Shindo et al. | |
| 6,485,542 B2 | 11/2002 | Shindo et al. | |
| 7,909,949 B2 | 3/2011 | Nakamura et al. | |
| 8,663,402 B2 | 3/2014 | Nakamura et al. | |
| 9,011,653 B2 * | 4/2015 | Ikeda ................. | C23C 14/3414 204/298.12 |

(Continued)

FOREIGN PATENT DOCUMENTS

JP  S63-259068 A  10/1988
JP  H03-288321 A  12/1991

(Continued)

*Primary Examiner* — Xiaowei Su
(74) *Attorney, Agent, or Firm* — Howson & Howson LLP (57) ABSTRACT

An Fe-based magnetic material sintered compact containing BN, wherein the Fe-based magnetic material sintered compact has an oxygen content of 4000 wtppm or less. The present invention provides a sintered compact which enables the formation of a magnetic thin film in a thermally assisted magnetic recording media, and in which the generation of cracks and chipping is suppressed when the sintered compact is processed into a sputtering target or the like.

4 Claims, 3 Drawing Sheets

(56) References Cited

U.S. PATENT DOCUMENTS

| | | | |
|---|---|---|---|
| 2006/0014052 A1* | 1/2006 | Watanabe | G11B 5/65 428/842 |
| 2006/0222897 A1 | 10/2006 | Kamata et al. | |
| 2007/0020487 A1 | 1/2007 | Lim et al. | |
| 2008/0017277 A1 | 1/2008 | Fujimori et al. | |
| 2009/0252865 A1 | 10/2009 | Sagawa | |
| 2010/0055375 A1 | 3/2010 | Sasa et al. | |
| 2010/0189886 A1* | 7/2010 | Peng | G11B 5/65 427/130 |
| 2011/0162971 A1 | 7/2011 | Nakamura et al. | |
| 2012/0241316 A1 | 9/2012 | Arakawa | |
| 2012/0273347 A1 | 11/2012 | Koide | |
| 2013/0168240 A1 | 7/2013 | Ogino et al. | |
| 2013/0206591 A1 | 8/2013 | Takami et al. | |
| 2013/0213803 A1* | 8/2013 | Sato | B22F 3/14 204/298.13 |
| 2013/0248362 A1 | 9/2013 | Ogino et al. | |
| 2013/0292245 A1 | 11/2013 | Ikeda et al. | |
| 2014/0083847 A1 | 3/2014 | Sato | |
| 2014/0311902 A1* | 10/2014 | Ogino | C22C 19/07 204/298.13 |
| 2015/0060268 A1* | 3/2015 | Ogino | B22F 1/0081 204/298.13 |
| 2015/0107991 A1* | 4/2015 | Sato | C23C 14/3414 204/298.13 |
| 2015/0213822 A1* | 7/2015 | Ogino | G11B 5/65 75/233 |

FOREIGN PATENT DOCUMENTS

| | | | | |
|---|---|---|---|---|
| JP | H06-49510 A | 2/1994 | | |
| JP | H07-26369 A | 1/1995 | | |
| JP | H08-245295 A | 9/1996 | | |
| JP | 2003-313659 A | 11/2003 | | |
| JP | 2010-159491 A | 7/2010 | | |
| JP | 2012-102387 A | 5/2012 | | |
| JP | WO2012086335 A1 * | 6/2012 | | |
| WO | WO 2012029498 A1 * | 3/2012 | | C23C 14/3414 |
| WO | WO 2012073882 A1 * | 6/2012 | | C23C 14/3414 |

* cited by examiner

FE-BASES MAGNETIC MATERIAL SINTERED COMPACT

BACKGROUND

The present invention relates to a sintered compact that is used for the production of a magnetic thin film in a thermally assisted magnetic recording media, and to a method of producing such a sintered compact.

In the field of magnetic recording as represented with hard disk drives, a material that is based on a ferromagnetic metal such as Co, Fe, or Ni is being used as the material of a magnetic thin film in a magnetic recording medium. For example, a Co—Cr-based or a Co—Cr—Pt-based ferromagnetic alloy having Co as its main component has been used for the magnetic thin film of a hard disk that adopts the longitudinal magnetic recording system. Moreover, a composite material made from a Co—Cr—Pt-based ferromagnetic alloy having Co as its main component and nonmagnetic inorganic grains is often used for the magnetic thin film of a hard disk that adopts the perpendicular magnetic recording system which has been put into practical use in recent years. In addition, these magnetic thin films are often produced by sputtering a sputtering target made from the foregoing materials using a DC magnetron sputtering equipment in light of its high productivity.

The recording density of hard disks is rapidly increasing year by year, and the current surface density of 600 Gbit/in$^2$ is expected to reach 1 Tbit/in$^2$ in the future. When the recording density reaches 1 Tbit/in$^2$, the size of the recording bit will fall below 10 nm. In such a case, it is anticipated that the superparamagnetization caused by thermal fluctuation will become a problem, and it is further anticipated that the currently used materials of a magnetic recording medium; for instance, a material with higher magnetic crystalline anisotropy obtained by adding Pt to a Co—Cr-based alloy; will no longer be sufficient. This is because magnetic grains, which stably behave as a ferromagnetic at a size of 10 nm or less, need to possess even higher magnetic crystalline anisotropy.

Based on the reasons described above, an FePt phase having an $L1_0$ structure is attracting attention as a material for use in an ultrahigh density recording medium. Since an FePt phase yields superior corrosion resistance and oxidation resistance in addition to having high magnetic crystalline anisotropy, it is expected to become a material that can be suitably applied for a magnetic recording medium. Furthermore, in connection with using the FePt phase as a material for use in an ultrahigh density recording medium, demanded is the development of technology for dispersing the ordered FePt magnetic grains, in a magnetically isolated state, while densely aligning the orientation thereof as much as possible.

In light of the foregoing circumstances, a magnetic thin film having a granular structure in which the FePt magnetic grains having an $L1_0$ structure are isolated through the interposition of nonmagnetic materials such as oxides and carbon is being proposed for use in a magnetic recording medium of next-generation hard disks adopting the thermally assisted magnetic recording system. This magnetic thin film has a granular structure in which the magnetic grains are magnetically insulated from each other through the interposition of nonmagnetic substances. Generally speaking, this kind of granular structure magnetic thin film is deposited using a sputtering target of Fe-based magnetic material sintered compact.

With regard to a sputtering target of Fe-based magnetic material sintered compact, the present inventors have previously disclosed a technology relating to a sputtering target of ferromagnetic material sintered compact which is configured from a magnetic phase such as an Fe—Pt alloy, and a nonmagnetic phase which separates the magnetic phase, and in which a metal oxide is used as one of the nonmagnetic phase materials (Patent Document 1).

Moreover, Patent Document 2 discloses a sputtering target for use for film deposition for a magnetic recording medium, which is made from a sintered compact having a structure in which a C layer is dispersed in an FePt alloy phase. Moreover, Patent Document 3 discloses a magnetic material sputtering target containing B, and the remainder being one or more elements selected from Co, Fe, and Ni. Moreover, Patent Document 4 discloses a sputtering target for a recording medium, which is configured from one or more elements selected from Fe and Co, and one or more elements selected from Pt and Pd, and in which the oxygen content is 1000 ppm or less. Moreover, Patent Document 5 discloses a target for use in forming a permalloy film, which is made from a sintered compact composed of nickel in an amount of 78 to 85 wt %, and the remainder being iron, and in which the concentration of oxygen as an impurity is 25 ppm or less. In addition, Patent Document 6 discloses a Ni—Fe alloy sputtering target for forming a magnetic thin film, in which the oxygen content is 50 ppm or less.

Meanwhile, since Fe as a magnetic material tends to become ionized, Fe easily reacts with oxygen in the atmosphere or in an atmosphere containing oxygen to form an iron oxide. Nevertheless, since iron oxide is extremely brittle, when iron oxide exists in the sintered compact, there is a problem in that the iron oxide causes the machinability of the sintered compact to deteriorate considerably due to the generation of cracks or chipping when the sintered compact is processed into a sputtering target or the like, and consequently deteriorates the yield. In particular, when a sinter resistance material such as C or BN exists in the sintered compact, there is a problem in that the machinability will deteriorate even further in comparison to the sintered compacts which are based on other components.

Patent Document 1: International Publication No. WO2012/029498
Patent Document 2: JP 2012-102387 A
Patent Document 3: International Publication No. WO2011/070860
Patent Document 4: JP 2003-313659 A
Patent Document 5: JP H07-026369 A
Patent Document 6: JP H11-335821 A

SUMMARY

An object of the present invention is to provide a Fe-based magnetic material sintered compact which uses BN as the nonmagnetic material and which enables the formation of a magnetic thin film in a thermally assisted magnetic recording media, and to particularly provide a sintered compact with improved machinability by reducing the amount of oxygen in the sintered compact.

In order to achieve the foregoing object, as a result of intense study, the present inventors discovered that an Fe-based magnetic material sintered compact, in which amount of oxygen is significantly reduced, can be produced by adjusting the form of the Fe powder that is used as a raw material. In addition, the present inventors further discovered that the thus produced sintered compact yields favorable machinability, can suppress the generation of cracks and chipping when processed into a sputtering target or the like, and can improve the production yield.

Based on the foregoing discovery, the present invention provides:

1) An Fe-based magnetic material sintered compact containing BN, wherein the Fe-based magnetic material sintered compact has an oxygen content of 4000 wtppm or less;
2) The Fe-based magnetic material sintered compact according to 1) above, wherein Pt is contained in an amount of 5 mol % or more and 60 mol % or less, BN is contained in an amount of 1 mol % or more and 50 mol % or less, and remainder is Fe;
3) The Fe-based magnetic material sintered compact according to 1) or 2) above, wherein C is further contained in an amount of 0.5 mol % or more and 40 mol % or less;
4) The Fe-based magnetic material sintered compact according to any one of 1) to 3) above, wherein one or more elements selected from a group composed of B, Ru, Ag, Au, and Cu are contained as an additive element in an amount of 0.5 mol % or more and 10.0 mol % or less; and
5) The Fe-based magnetic material sintered compact according to any one of 1) to 4) above, wherein one or more inorganic materials selected from a group composed of oxide, nitride, carbide, and carbonitride are contained as an additive material.

The Fe-based magnetic material sintered compact containing BN according to the present invention can particularly suppress the generation of cracks and chipping when the sintered compact is processed into a sputtering target. Therefore, when sputtering is performed using this sputtering target, a superior effect is yielded in that a quality thin film, particularly a magnetic thin film having a granular structure, can be deposited with minimal generation of abnormal discharge and particles.

DETAILED DESCRIPTION

The Fe-based magnetic material sintered compact of the present invention is characterized in containing BN as the nonmagnetic material, and being able to reduce the oxygen content. Since oxygen easily reacts with Fe in the sintered compact, and thus forms an extremely brittle iron oxide, the amount of oxygen is reduced to be 4000 wtppm or less. The amount of oxygen is preferably 1000 wtppm or less, and more preferably 500 wtppm or less.

Moreover, the Fe-based magnetic material sintered compact of the present invention may also contain Pt in an amount of 5 mol % or more and 60 mol % or less, BN in an amount of 1 mol % or more and 50 mol % or less, and remainder being Fe. There are cases where favorable magnetic properties cannot be obtained when the Pt content is less than 5 mol % or exceeds 60 mol %. Moreover, there are cases where the magnetic insulation becomes insufficient when the BN content is less than 1 mol % or exceeds 50 mol %.

Moreover, in the Fe-based magnetic material sintered compact of the present invention, is it effective to disperse C grains in the alloy. The C content is preferably 0.5 mol % or more and 40 mol % or less. When the C content is less than 0.5 mol % or exceeds 40 mol %, the magnetic insulation becomes insufficient.

Moreover, the Fe-based magnetic material sintered compact of the present invention can contain, as an additive element, one or more elements selected from a group composed of B, Ru, Ag, Au, and Cu in a total amount of 0.5 mol % or more and 10.0 mol % or less. These additive elements are effective components for improving the magnetic properties of the sputtered film.

Moreover, the Fe-based magnetic material sintered compact of the present invention preferably contains, as an additive material, one or more inorganic materials selected from a group composed of oxide, nitride, carbide, and carbonitride. These additive materials have the function of improving the sinterability of BN and the base material alloy in the sintered compact. Here, the foregoing oxide refers to an oxide other than iron oxide, and the oxygen contained therein is excluded from the oxygen content defined in the present invention.

The Fe-based magnetic material sintered compact of the present invention can be produced, for example, according to the following method.

Foremost, raw material powders are prepared and weighed to achieve the intended composition, and are subject to mixing based on a publicly known method. When an Fe powder is used as the raw material powder, since the Fe powder has a large surface area in comparison to bulky powder, the Fe powder tends to react with oxygen. In addition, as the grain size of the powder becomes smaller, the surface area will increase, and oxidation will advance. Accordingly, when an Fe powder is to be used as the raw material, it is important that mixing is performed based on a method that does not involve pulverization of the Fe powder. Accordingly, it is desirable to avoid a mixing device such as a ball mill or a medium agitation mill that involves pulverization, and use a mixing device such as a mortar or a V-type mixer in which pulverization is relatively minimal.

Moreover, when Pt is contained in the component as a raw material powder, by alloying the Fe and Pt by subjecting the Fe and Pt to heat treatment or the atomizing method in advance, it is possible to produce an Fe—Pt alloy powder that does not oxidize easily in comparison to using Fe independently. Even when the thus produced Fe—Pt alloy powder is pulverized and mixed using a ball mill or a medium agitation mill, it is possible to maintain the oxygen content at a low level.

The grain size of these powders to be used is desirably 0.5 μm or more and 10 μm or less. When the grain size of the raw material powder is too small, there are problems in that the oxidization is promoted and the oxygen concentration in the sputtering target increases and, therefore, the grain size of the raw material powder is desirably 0.5 μm or more. Meanwhile, when the grain size of the raw material powder is too large, it becomes difficult for the respective components to be finely dispersed in the alloy and, therefore, the grain size of the raw material powder is desirably 10 μm or less. Moreover, even when using an alloy powder, the grain size of such alloy powder to be used is desirably 0.5 μm or more and 10 μm or less.

The thus obtained mixed powder is molded and sintered via hot press. In substitution for hot press, the plasma discharge sintering method or the hot isostatic pressure sintering method may be used. While the holding temperature during sintering will depend on the composition of the sputtering target, in many cases, the holding temperature is within a range of 800° C. to 1400° C.

Subsequently, the sintered compact is removed from the hot press and subject to hot isostatic pressing. Hot isostatic pressing is effective for increasing the density of the sintered compact. While the holding temperature during the hot isostatic pressing will depend on the composition of the sintered compact, in many cases, the holding temperature is within a range of 900° C. to 1200° C. Moreover, the pressure is set to be 100 MPa or more.

It is thereby possible to produce an Fe-based magnetic material sintered compact containing BN, which is a sintered compact having an oxygen content of 4000 wtppm or less. Moreover, a sputtering target can be produced by processing the thus obtained sintered compact into an intended shape using a lathe.

EXAMPLES

The present invention is now explained based on the following Examples and Comparative Examples. Note that these Examples are merely illustrative, and the present invention is not limited in any way by these Examples. In other words, the present invention is limited only based on its scope of claims, and the present invention covers various modifications other than the Examples included herein.

Example 1

As raw material powders, an Fe—Pt alloy powder, a Ag powder, and a BN powder were prepared. These powders were weighed to achieve 60(45Fe-45Pt-10Ag)-40BN (mol %).

Next, the weighed powders were placed in a mortar and uniformly mixed. Subsequently, the mixed powder that was removed from the mortar was filled in a carbon mold and hot pressed.

The hot press conditions were as follows; namely, a vacuum atmosphere, rate of temperature increase of 300° C./hour, holding temperature of 950° C., holding time of 2 hours, and pressure of 30 MPa was applied from the start of temperature increase to the end of the holding time. After the end of holding, the sintered compact was left in the chamber and cooled naturally.

Subsequently, the sintered compact was removed from the carbon mold and subject to hot isostatic pressing. The hot isostatic pressing conditions were as follows; namely, rate of temperature increase of 300° C./hour, holding temperature of 950° C., holding time of 2 hours, Ar gas pressure was gradually increased from the start of temperature increase, and pressure of 150 MPa was applied during holding at 950° C. After the end of holding, the sintered compact was left in the furnace and cooled naturally.

The density of the thus produced sintered compact was measured based on the Archimedes' method, and the calculated relative density was 96.9%.

Moreover, as a result of measuring the oxygen content of the obtained sintered compact, the oxygen content was low at 3500 wtppm. Note that TC-600 manufactured by LECO was used as the oxygen analyzer, and analysis was performed based on the inert gas dissolution method.

Figure 1:
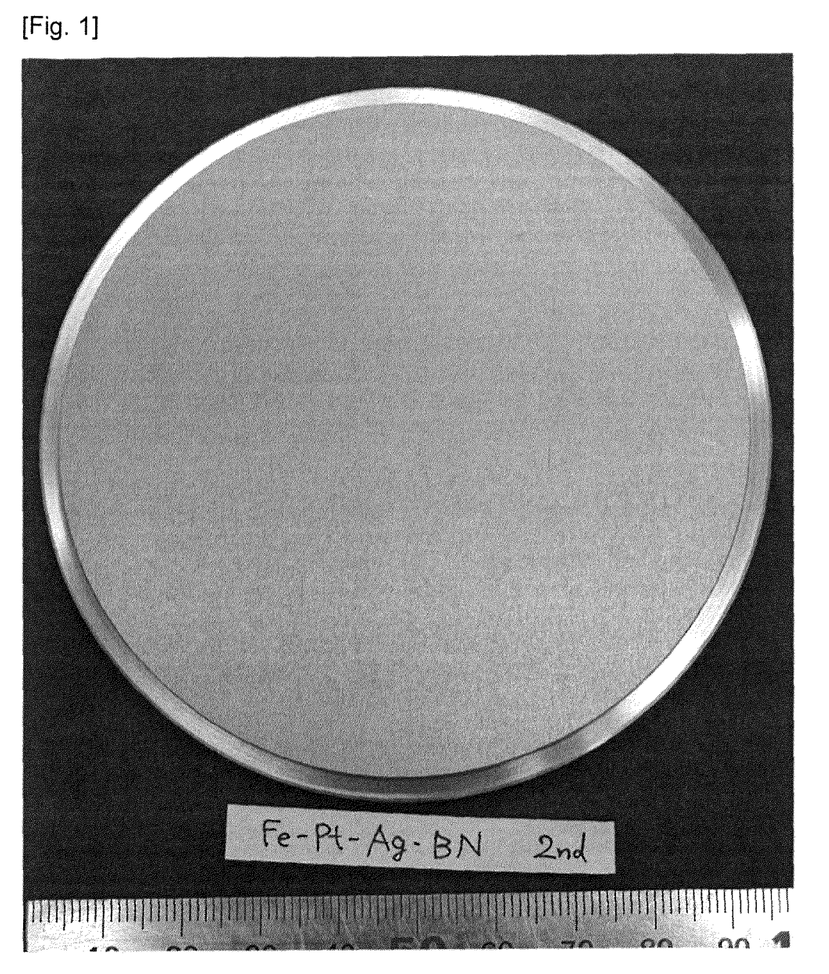
FIG. 1 This is a photograph of the surface of the target after the sintered compact of Example 1 was processed into that target.

Subsequently, the sintered compact was cut with a lathe to obtain a target in a shape having diameter of 90.0 mm and a thickness of 4.0 mm, and the target surface was observed. The exterior photograph of the machined target is shown in FIG. 1. As shown in FIG. 1, there were no cracks or chipping on the target surface, and it was confirmed that the target surface was finished cleanly.

Comparative Example 1

As raw material powders, an Fe powder, a Pt powder, a Ag powder, and a BN powder were prepared. These powders were weighed to achieve 60(45Fe-45Pt-10Ag)-40BN (mol %).

Next, the weighed powders were placed in a medium agitation mill having a capacity of 5 L together with zirconia balls as the grinding medium, and mixed and pulverized by being rotated (rotating speed: 300 rpm) for 2 hours. The mixed powder that was removed from the medium agitation mill was filled in a carbon mold and hot pressed.

The hot press conditions were the same as Example 1; namely, a vacuum atmosphere, rate of temperature increase of 300° C./hour, holding temperature of 950° C., holding time of 2 hours, and pressure of 30 MPa was applied from the start of temperature increase to the end of the holding time. After the end of holding, the sintered compact was left in the chamber and cooled naturally.

Subsequently, the sintered compact was removed from the carbon mold and subject to hot isostatic pressing. The hot isostatic pressing conditions were the same as Example 1; namely, rate of temperature increase of 300° C./hour, holding temperature of 950° C., holding time of 2 hours, Ar gas pressure was gradually increased from the start of temperature increase, and pressure of 150 MPa was applied during holding at 950° C. After the end of holding, the sintered compact was left in the furnace and cooled naturally.

The density of the thus produced sintered compact was measured based on the Archimedes' method, and the calculated relative density was 96.0%.

Moreover, as a result of measuring the oxygen content of the obtained sintered compact based on the same method as Example 1, the oxygen content increased considerably at 13000 wtppm in comparison to Example 1. Note that the oxygen content was measured based on the same method as Example 1.

Figure 2:
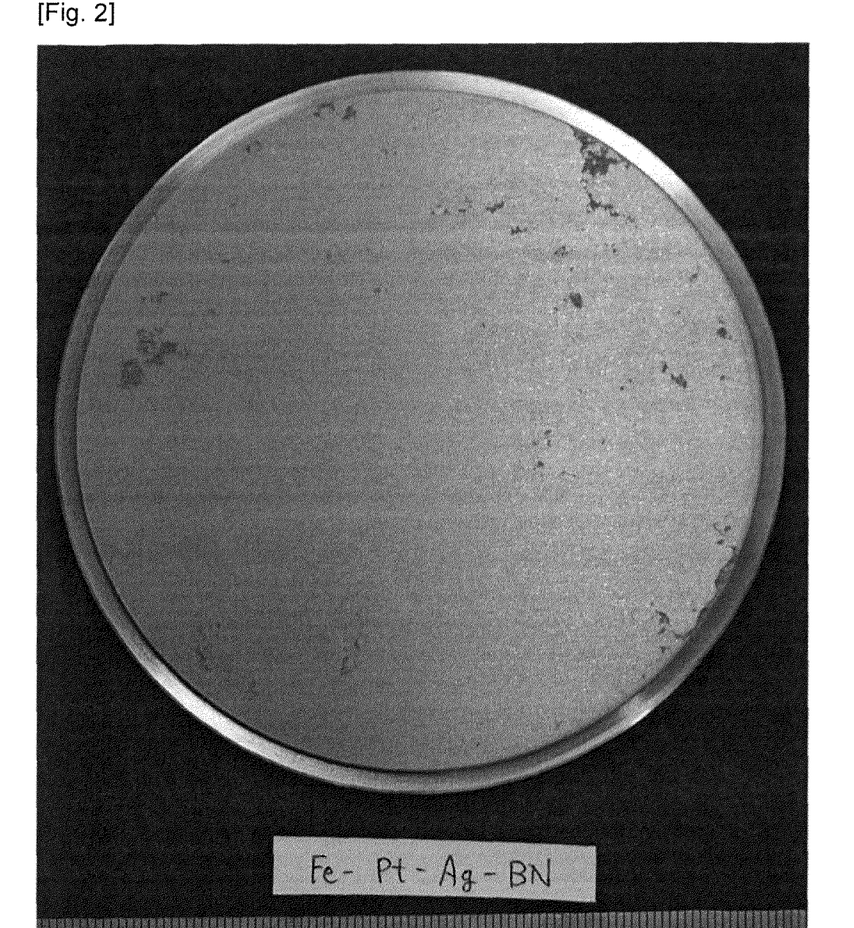
FIG. 2 This is a photograph of the surface of the target after the sintered compact of Comparative Example 1 was processed into that target.

Subsequently, the sintered compact was cut with a lathe to obtain a target in a shape having diameter of 90.0 mm and a thickness of 4.0 mm, and the target surface was observed. The exterior photograph of the machined target is shown in FIG. 2. As shown in FIG. 2, it was confirmed that the target surface was subject to severe chipping.

Figure 3:
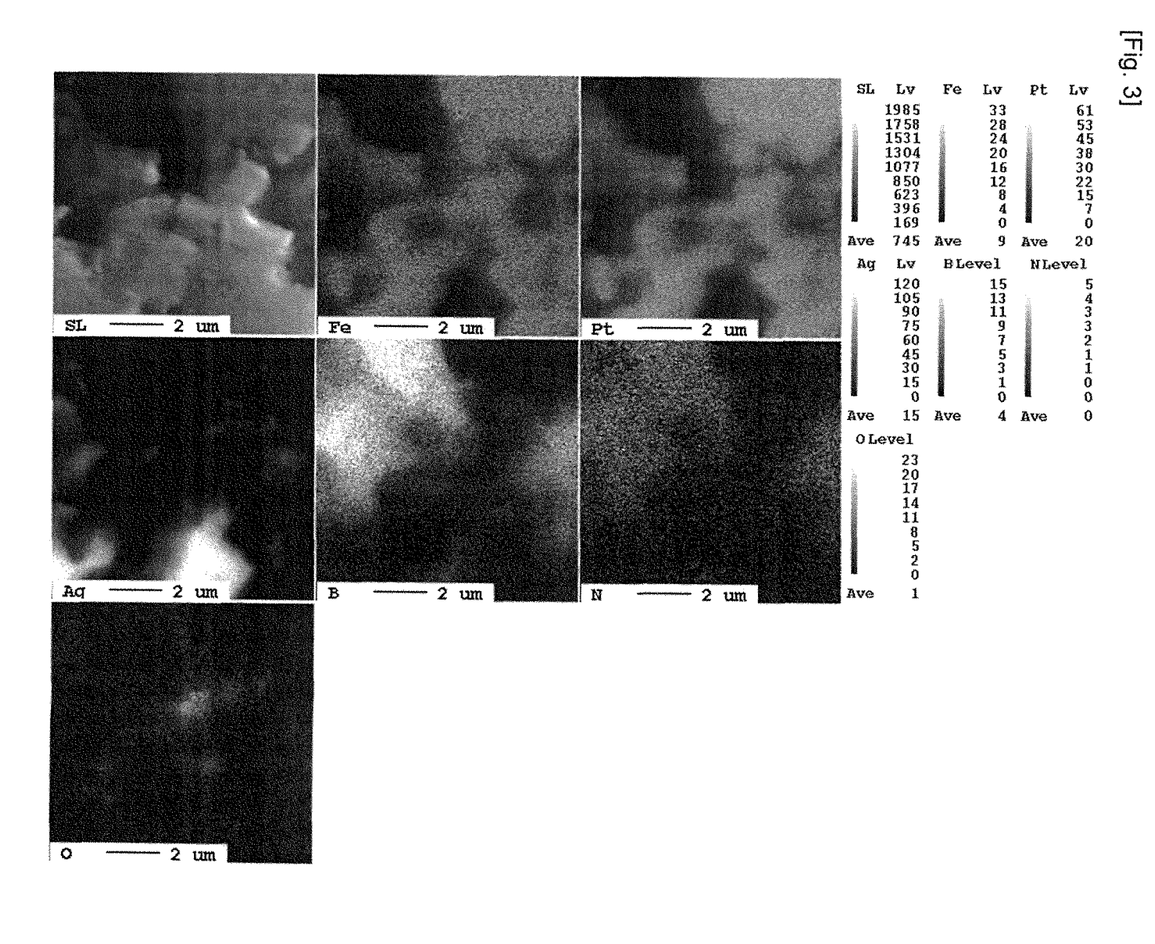
FIG. 3 This is an element mapping of the cut surface of the sintered compact of Example 1 that was obtained based on FE-EPMA.

Note that, as a result of cutting the end face of the sintered compact, polishing the cut surface thereof and analyzing the structure with FE-EPMA (refer to FIG. 3), oxygen and iron were observed in the substantially same area, and it was confirmed that iron oxide has been formed.

Example 2

As raw material powders, an Fe—Pt alloy powder, and a BN powder were prepared. These powders were weighed to achieve 70(50Fe-50Pt)-30BN (mol %).

Next, the weighed powders were placed in a mortar and uniformly mixed. Subsequently, the mixed powder that was removed from the mortar was filled in a carbon mold and hot pressed.

The hot press conditions were as follows; namely, a vacuum atmosphere, rate of temperature increase of 300° C./hour, holding temperature of 1400° C., holding time of 2 hours, and pressure of 30 MPa was applied from the start of temperature increase to the end of the holding time. After the end of holding, the sintered compact was left in the chamber and cooled naturally.

Subsequently, the sintered compact was removed from the carbon mold and subject to hot isostatic pressing. The hot isostatic pressing conditions were as follows; namely, rate of temperature increase of 300° C./hour, holding temperature of 1100° C., holding time of 2 hours, Ar gas pressure was gradually increased from the start of temperature increase, and pressure of 150 MPa was applied during holding at 1100° C. After the end of holding, the sintered compact was left in the furnace and cooled naturally.

The density of the thus produced sintered compact was measured based on the Archimedes' method, and the calculated relative density was 98.3%.

Moreover, as a result of measuring the oxygen content of the obtained sintered compact, the oxygen content was low at 3100 wtppm. Note that the oxygen content was measured based on the same method as Example 1.

Subsequently, the sintered compact was cut with a lathe to obtain a target in a shape having diameter of 90.0 mm and a thickness of 4.0 mm. As a result of observing the target surface, there were no cracks or chipping on the target surface, and it was confirmed that the target surface was finished cleanly.

Example 3

As raw material powders, an Fe—Pt alloy powder, a Ag powder, a BN powder, and a C powder were prepared. These powders were weighed to achieve 65(45Fe-45Pt-10Ag)-5BN-30C (mol %).

Next, the weighed powders were placed in a mortar and uniformly mixed. Subsequently, the mixed powder that was removed from the mortar was filled in a carbon mold and hot pressed.

The hot press conditions were as follows; namely, a vacuum atmosphere, rate of temperature increase of 300° C./hour, holding temperature of 950° C., holding time of 2 hours, and pressure of 30 MPa was applied from the start of temperature increase to the end of the holding time. After the end of holding, the sintered compact was left in the chamber and cooled naturally.

Subsequently, the sintered compact was removed from the carbon mold and subject to hot isostatic pressing. The hot isostatic pressing conditions were as follows; namely, rate of temperature increase of 300° C./hour, holding temperature of 950° C., holding time of 2 hours, Ar gas pressure was gradually increased from the start of temperature increase, and pressure of 150 MPa was applied during holding at 950° C. After the end of holding, the sintered compact was left in the furnace and cooled naturally.

The density of the thus produced sintered compact was measured based on the Archimedes' method, and the calculated relative density was 96.8%.

Moreover, as a result of measuring the oxygen content of the obtained sintered compact, the oxygen content was low at 3400 wtppm. Note that the oxygen content was measured based on the same method as Example 1.

Subsequently, the sintered compact was cut with a lathe to obtain a target in a shape having diameter of 90.0 mm and a thickness of 4.0 mm. As a result of observing the target surface, there were no cracks or chipping on the target surface, and it was confirmed that the target surface was finished cleanly.

Example 4

As raw material powders, an Fe—Pt alloy powder, a Cu powder, a BN powder, and a C powder were prepared. These powders were weighed to achieve 65(30Fe-60Pt-10Cu)-5BN-30C (mol %).

Next, the weighed powders were placed in a mortar and uniformly mixed. Subsequently, the mixed powder that was removed from the mortar was filled in a carbon mold and hot pressed.

The hot press conditions were as follows; namely, a vacuum atmosphere, rate of temperature increase of 300° C./hour, holding temperature of 1060° C., holding time of 2 hours, and pressure of 30 MPa was applied from the start of temperature increase to the end of the holding time. After the end of holding, the sintered compact was left in the chamber and cooled naturally.

Subsequently, the sintered compact was removed from the carbon mold and subject to hot isostatic pressing. The hot isostatic pressing conditions were as follows; namely, rate of temperature increase of 300° C./hour, holding temperature of 1100° C., holding time of 2 hours, Ar gas pressure was gradually increased from the start of temperature increase, and pressure of 150 MPa was applied during holding at 1100° C. After the end of holding, the sintered compact was left in the furnace and cooled naturally.

The density of the thus produced sintered compact was measured based on the Archimedes' method, and the calculated relative density was 96.8%.

Moreover, as a result of measuring the oxygen content of the obtained sintered compact, the oxygen content was low at 3300 wtppm. Note that the oxygen content was measured based on the same method as Example 1.

Subsequently, the sintered compact was cut with a lathe to obtain a target in a shape having diameter of 90.0 mm and a thickness of 4.0 mm. As a result of observing the target surface, there were no cracks or chipping on the target surface, and it was confirmed that the target surface was finished cleanly.

Comparative Example 2

As raw material powders, an Fe powder, a Pt powder, a Cu powder, a BN powder, and a C powder were prepared. These powders were weighed to achieve 65(30Fe-60Pt-10Cu)-5BN-30C (mol %).

Next, the weighed powders were placed in a medium agitation mill having a capacity of 5 L together with zirconia balls as the grinding medium, and mixed and pulverized by being rotated (rotating speed: 300 rpm) for 2 hours. The mixed powder that was removed from the medium agitation mill was filled in a carbon mold and hot pressed.

The hot press conditions were the same as Example 1; namely, a vacuum atmosphere, rate of temperature increase of 300° C./hour, holding temperature of 1060° C., holding time of 2 hours, and pressure of 30 MPa was applied from the start of temperature increase to the end of the holding time. After the end of holding, the sintered compact was left in the chamber and cooled naturally.

Subsequently, the sintered compact was removed from the carbon mold and subject to hot isostatic pressing. The hot isostatic pressing conditions were the same as Example 1; namely, rate of temperature increase of 300° C./hour, holding temperature of 1100° C., holding time of 2 hours, Ar gas pressure was gradually increased from the start of temperature increase, and pressure of 150 MPa was applied during holding at 1100° C. After the end of holding, the sintered compact was left in the furnace and cooled naturally.

The density of the thus produced sintered compact was measured based on the Archimedes' method, and the calculated relative density was 96.0%.

Moreover, as a result of measuring the oxygen content of the obtained sintered compact based on the same method as Example 1, the oxygen content increased considerably at 11800 wtppm in comparison to Example 4. Note that the oxygen content was measured based on the same method as Example 1.

Subsequently, the sintered compact was cut with a lathe to obtain a target in a shape having diameter of 90.0 mm and a thickness of 4.0 mm, and the target surface was observed. Consequently, it was confirmed that the target surface was subject to severe chipping.

Note that, as a result of cutting the end face of the sintered compact, polishing the cut surface thereof and analyzing the structure with FE-EPMA, oxygen and iron were observed in the substantially same area, and it was confirmed that iron oxide has been formed.

Example 5

As raw material powders, an Fe—Pt alloy powder, a Ag powder, a BN powder, and a SiC powder were prepared. These powders were weighed to achieve 85(60Fe-30Pt-10Ag)-10BN-5SiC (mol %).

Next, the weighed powders were placed in a mortar and uniformly mixed. Subsequently, the mixed powder that was removed from the mortar was filled in a carbon mold and hot pressed.

The hot press conditions were as follows; namely, a vacuum atmosphere, rate of temperature increase of 300° C./hour, holding temperature of 950° C., holding time of 2 hours, and pressure of 30 MPa was applied from the start of temperature increase to the end of the holding time. After the end of holding, the sintered compact was left in the chamber and cooled naturally.

Subsequently, the sintered compact was removed from the carbon mold and subject to hot isostatic pressing. The hot isostatic pressing conditions were as follows; namely, rate of temperature increase of 300° C./hour, holding temperature of 950° C., holding time of 2 hours, Ar gas pressure was gradually increased from the start of temperature increase, and pressure of 150 MPa was applied during holding at 950° C. After the end of holding, the sintered compact was left in the furnace and cooled naturally.

The density of the thus produced sintered compact was measured based on the Archimedes' method, and the calculated relative density was 96.8%.

Moreover, as a result of measuring the oxygen content of the obtained sintered compact, the oxygen content was low at 2400 wtppm. Note that the oxygen content was measured based on the same method as Example 1.

Subsequently, the sintered compact was cut with a lathe to obtain a target in a shape having diameter of 90.0 mm and a thickness of 4.0 mm. As a result of observing the target surface, there were no cracks or chipping on the target surface, and it was confirmed that the target surface was finished cleanly.

Comparative Example 3

As raw material powders, an Fe powder, a Pt powder, a Ag powder, a BN powder, and a SiC powder were prepared. These powders were weighed to achieve 85(60Fe-30Pt-10Ag)-10BN-5SiC (mol %).

Next, the weighed powders were placed in a medium agitation mill having a capacity of 5 L together with zirconia balls as the grinding medium, and mixed and pulverized by being rotated (rotating speed: 300 rpm) for 2 hours. The mixed powder that was removed from the medium agitation mill was filled in a carbon mold and hot pressed.

The hot press conditions were the same as Example 1; namely, a vacuum atmosphere, rate of temperature increase of 300° C./hour, holding temperature of 950° C., holding time of 2 hours, and pressure of 30 MPa was applied from the start of temperature increase to the end of the holding time. After the end of holding, the sintered compact was left in the chamber and cooled naturally.

Subsequently, the sintered compact was removed from the carbon mold and subject to hot isostatic pressing. The hot isostatic pressing conditions were the same as Example 1; namely, rate of temperature increase of 300° C./hour, holding temperature of 950° C., holding time of 2 hours, Ar gas pressure was gradually increased from the start of temperature increase, and pressure of 150 MPa was applied during holding at 950° C. After the end of holding, the sintered compact was left in the furnace and cooled naturally.

The density of the thus produced sintered compact was measured based on the Archimedes' method, and the calculated relative density was 96.0%.

Moreover, as a result of measuring the oxygen content of the obtained sintered compact based on the same method as Example 1, the oxygen content increased considerably at 11500 wtppm in comparison to Example 5. Note that the oxygen content was measured based on the same method as Example 1.

Subsequently, the sintered compact was cut with a lathe to obtain a target in a shape having diameter of 90.0 mm and a thickness of 4.0 mm, and the target surface was observed. Consequently, it was confirmed that the target surface was subject to severe chipping.

Note that, as a result of cutting the end face of the sintered compact, polishing the cut surface thereof and analyzing the structure with FE-EPMA, oxygen and iron were observed in the substantially same area, and it was confirmed that iron oxide has been formed.

Example 6

As raw material powders, an Fe—Pt alloy powder, a Fe—B powder, a Ru powder, a BN powder, and a C powder were prepared. These powders were weighed to achieve 70(60Fe-30Pt-5B-5Ru)-10BN-20C (mol %).

Next, the weighed powders were placed in a mortar and uniformly mixed. Subsequently, the mixed powder that was removed from the mortar was filled in a carbon mold and hot pressed.

The hot press conditions were as follows; namely, a vacuum atmosphere, rate of temperature increase of 300° C./hour, holding temperature of 1200° C., holding time of 2 hours, and pressure of 30 MPa was applied from the start of temperature increase to the end of the holding time. After the end of holding, the sintered compact was left in the chamber and cooled naturally.

Subsequently, the sintered compact was removed from the carbon mold and subject to hot isostatic pressing. The hot isostatic pressing conditions were as follows; namely, rate of temperature increase of 300° C./hour, holding temperature of 1100° C., holding time of 2 hours, Ar gas pressure was gradually increased from the start of temperature increase, and pressure of 150 MPa was applied during holding at 1100° C. After the end of holding, the sintered compact was left in the furnace and cooled naturally.

The density of the thus produced sintered compact was measured based on the Archimedes' method, and the calculated relative density was 96.8%.

Moreover, as a result of measuring the oxygen content of the obtained sintered compact, the oxygen content was low at 3000 wtppm. Note that the oxygen content was measured based on the same method as Example 1.

Subsequently, the sintered compact was cut with a lathe to obtain a target in a shape having diameter of 90.0 mm and a thickness of 4.0 mm. As a result of observing the target surface, there were no cracks or chipping on the target surface, and it was confirmed that the target surface was finished cleanly.

Comparative Example 4

As raw material powders, an Fe powder, a Pt powder, an Fe—B powder, a Ru powder, a BN powder, and a C powder were prepared. These powders were weighed to achieve 70(60Fe-30Pt-5B-5Ru)-10BN-20C (mol %).

Next, the weighed powders were placed in a medium agitation mill having a capacity of 5 L together with zirconia balls as the grinding medium, and mixed and pulverized by being rotated (rotating speed: 300 rpm) for 2 hours. The mixed powder that was removed from the medium agitation mill was filled in a carbon mold and hot pressed.

The hot press conditions were the same as Example 1; namely, a vacuum atmosphere, rate of temperature increase of 300° C./hour, holding temperature of 1200° C., holding time of 2 hours, and pressure of 30 MPa was applied from the start of temperature increase to the end of the holding time. After the end of holding, the sintered compact was left in the chamber and cooled naturally.

Subsequently, the sintered compact was removed from the carbon mold and subject to hot isostatic pressing. The hot isostatic pressing conditions were the same as Example 1; namely, rate of temperature increase of 300° C./hour, holding temperature of 1100° C., holding time of 2 hours, Ar gas pressure was gradually increased from the start of temperature increase, and pressure of 150 MPa was applied during holding at 1100° C. After the end of holding, the sintered compact was left in the furnace and cooled naturally.

The density of the thus produced sintered compact was measured based on the Archimedes' method, and the calculated relative density was 96.0%.

Moreover, as a result of measuring the oxygen content of the obtained sintered compact based on the same method as Example 1, the oxygen content increased considerably at 12300 wtppm in comparison to Example 6. Note that the oxygen content was measured based on the same method as Example 1.

Subsequently, the sintered compact was cut with a lathe to obtain a target in a shape having diameter of 90.0 mm and a thickness of 4.0 mm, and the target surface was observed. Consequently, it was confirmed that the target surface was subject to severe chipping.

Note that, as a result of cutting the end face of the sintered compact, polishing the cut surface thereof and analyzing the structure with FE-EPMA, oxygen and iron were observed in the substantially same area, and it was confirmed that iron oxide has been formed.

The results of the Examples and Comparative Examples are summarized in Table 1. As described above, it was possible to considerably reduce the amount of oxygen in the Fe-based magnetic material sintered compact by mixing the raw material Fe powder or Fe alloy powder based on a method that does not involve pulverization. In addition, it was possible to suppress the generation of cracks and chipping upon processing this kind of sintered compact into a sputtering target. Moreover, in addition to the compositions listed in the Examples, the same results were also obtained in cases of containing an additive element or an additive material.

The Fe-based magnetic material sintered compact containing BN with a reduced oxygen content according to the present invention yields a superior effect of being able to suppress the generation of cracks and chipping when the sintered compact is processed into a sputtering target or the like. In addition, when sputtering is performed using this kind of target, a superior effect is yielded in that a quality thin film can be formed with minimal generation of abnormal discharge and particles. Accordingly, this kind of sintered compact is particularly effective as a sputtering target for use in the deposition of a magnetic thin film having a granular structure.

The invention claimed is:

1. An Fe-based magnetic material sintered compact consisting of Pt in an amount of 5 mol % or more and 60 mol % or less, BN in an amount of 30 mol % or more and 40 mol % or less, C in an amount of 0.5 mol % or more and 40 mol % or less, an oxygen content of 4000 wtppm or less, and a balance being Fe, wherein the BN is dispersed as particles within the sintered compact, and wherein the sintered compact has a structure obtained by sintering raw material powders having a size of 0.5 μm or more and 10 μm of less.

2. An Fe-based magnetic material sintered compact consisting of Pt in an amount of 5 mol % or more and 60 mol % or less, BN in an amount of 30 mol % or more and 40 mol % or less, C in an amount of 0.5 mol % or more and 40 mol % or less, one or more elements selected from the group consisting of B, Ru, Ag, Au, and Cu in an amount of 0.5 mol % or more and 10.0 mol % or less, Fe, and an oxygen content of 4000 wtppm or less, wherein the BN is dispersed as particles within the sintered compact, and wherein the sintered compact has a structure obtained by sintering raw material powders having a size of 0.5 μm or more and 10 μm of less.

3. An Fe-based magnetic material sintered compact comprising Pt in an amount of 5 mol % or more and 60 mol % or less, BN in an amount of 30 mol % or more and 40 mol % or less, C in an amount of 0.5 mol % or more and 40 mol % or less, Fe, an oxygen content of 4000 wtppm or less as measured by an inert gas melting method, and one or more inorganic materials selected from the group consisting of an oxide other than iron oxide such that an amount of oxygen within said oxide other than iron oxide is not included in said oxygen content of 4000 wtppm or less, a nitride other than BN, a carbide, and a carbonitride, wherein the BN is dispersed as particles within the sintered compact and the one or more inorganic materials are dispersed within the sintered compact, and wherein the sintered compact has a structure obtained by sintering raw material powders having a size of 0.5 μm or more and 10 μm of less.

4. The Fe-based magnetic material sintered compact according to claim 3, wherein the sintered compact consists of Pt in an amount of 5 mol % or more and 60 mol % or less, BN in an amount of 30 mol % or more and 40 mol % or less, C in an amount of 0.5 mol % or more and 40 mol % or less, one or more elements selected from the group consisting of B, Ru, Ag, Au, and Cu in an amount of 0.5 mol % or more and 10.0 mol % or less, Fe, the oxygen content of 4000 wtppm or less, and the one or more inorganic materials.

* * * * *

UNITED STATES PATENT AND TRADEMARK OFFICE
CERTIFICATE OF CORRECTION

PATENT NO. : 10,090,012 B2
APPLICATION NO. : 14/384436
DATED : October 2, 2018
INVENTOR(S) : Ogino Page 1 of 1

It is certified that error appears in the above-identified patent and that said Letters Patent is hereby corrected as shown below:

On the Title Page

In the Title, "FE-BASES" should read "FE-BASED"

Signed and Sealed this
Sixth Day of August, 2019

Andrei Iancu
*Director of the United States Patent and Trademark Office*